United States Patent
Lee

(10) Patent No.: US 7,990,801 B2
(45) Date of Patent: Aug. 2, 2011

(54) INTERNAL WRITE/READ PULSE GENERATING CIRCUIT OF A SEMICONDUCTOR MEMORY APPARATUS

(75) Inventor: Sang-Hee Lee, Gyeonggi-Do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 107 days.

(21) Appl. No.: 12/480,938

(22) Filed: Jun. 9, 2009

(65) Prior Publication Data
US 2010/0165781 A1 Jul. 1, 2010

(30) Foreign Application Priority Data

Dec. 30, 2008 (KR) .................. 10-2008-0136423

(51) Int. Cl.
*G11C 8/00* (2006.01)
(52) U.S. Cl. .................. 365/233.1; 365/194; 365/210.1; 365/185.25
(58) Field of Classification Search .................. 365/233, 365/194, 210.1
See application file for complete search history.

(56) References Cited

U.S. PATENT DOCUMENTS

| 6,275,437 B1* | 8/2001 | Kim et al. ................ 365/189.02 |
| 6,556,482 B2 | 4/2003 | Shimoyama et al. |
| 7,609,565 B2* | 10/2009 | Lee ........................... 365/189.05 |
| 2008/0165610 A1 | 7/2008 | Kim et al. |
| 2008/0298142 A1* | 12/2008 | Chen et al. ..................... 365/194 |

FOREIGN PATENT DOCUMENTS

| KR | 1020060009578 | 2/2006 |
| KR | 1020060087009 | 8/2006 |

* cited by examiner

*Primary Examiner* — Connie C Yoha
(74) *Attorney, Agent, or Firm* — Venable LLP; Jeffri A. Kaminski

(57) ABSTRACT

A control clock generating unit outputs a clock as a control clock when a column address strobe pulse is input and fixes the control clock to a specific level when an all bank precharge signal or a refresh signal is enabled. An internal pulse generating unit outputs an external write pulse or an external read pulse as an internal write pulse or an internal read pulse in response to the control clock.

9 Claims, 5 Drawing Sheets

INTERNAL WRITE/READ PULSE GENERATING CIRCUIT OF A SEMICONDUCTOR MEMORY APPARATUS

CROSS-REFERENCES TO RELATED PATENT APPLICATION

The present application claims priority under 35 U.S.C 119(a) to Korean Application No. 10-2008-0136423, filed on Dec. 30, 2008, in the Korean Intellectual Property Office, which is incorporated herein by reference in its entirety as set forth in full.

BACKGROUND

1. Technical Field

The embodiment relates to a semiconductor memory apparatus, and in particular, to an internal write/read pulse generating circuit.

2. Related Art

A semiconductor memory apparatus is designed to perform write/read operations after a predetermined period of a clock when a write/read command are input from outside the memory apparatus.

An internal write/read pulse generating circuit used in a general semiconductor memory apparatus is configured to include an internal write/read pulse generating unit 10 as shown in FIG. 1 to output an internal write pulse 'WT_inp' or an internal read pulse 'RD_inp' after a predetermined period of a clock 'CLK' when an external write pulse 'WTP' or an external read pulse 'RDP' is input. At this time, the external write pulse 'WTP' is a pulse generated when a write command is input from the outside and the external read pulse 'RDP' is a pulse generated when a read command is input from the outside. Further, when the internal write pulse 'WT_inp' is output, the semiconductor memory apparatus performs the write operation and when the internal read pulse 'RD_inp' is output, the semiconductor memory apparatus performs the read operation.

The internal write/read pulse generating circuit of the general semiconductor memory apparatus configured as above is a circuit required for the write or read operation. However, the internal write/read pulse generating circuit has a problem in that transistors receiving the clock repeat turn ON/turn OFF operations due to toggling of the clock in the case of operations other than the write or read operation, thereby consuming current.

SUMMARY

Embodiments of the invention provide an internal write/read pulse generating circuit of a semiconductor memory apparatus capable of reducing current consumption.

According to one embodiment, an internal write/read pulse generating circuit of a semiconductor memory apparatus is configured to include: a control clock generating unit that outputs a clock as a control clock when a column address strobe pulse is input and fixes the control clock to a specific level when an all bank precharge signal or a refresh signal is enabled; and an internal pulse generating unit that outputs an external write pulse or an external read pulse as an internal write pulse or an internal read pulse in response to the control clock.

According to another embodiment, an internal write/read pulse generating circuit of a semiconductor memory apparatus outputs an external write pulse as an internal write pulse after a predetermined period of a clock or an external read pulse as an internal read pulse when the external write pulse or the external read pulse is input, wherein when a column address strobe pulse is input, transistors responding to the clocks among transistors configuring the internal write/read pulse generating circuit repeat a turn on or turn off operation according to the clocks and when an all bank precharge signal or a refresh signal is enabled, the transistors responding to the clocks are fixed to either of the turn on or turn off state.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
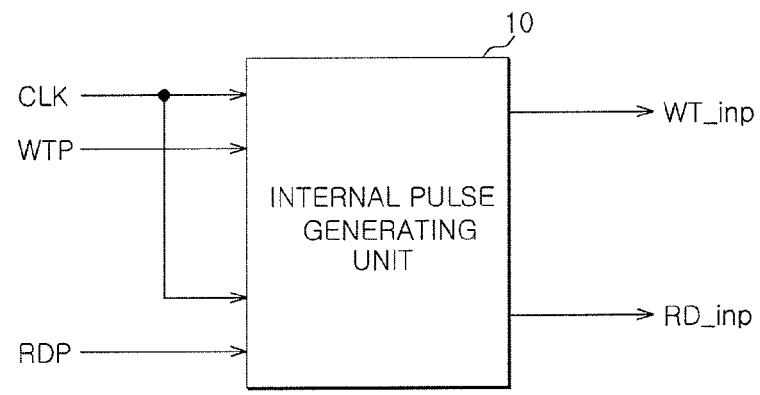
FIG. 1 is a block diagram schematically showing a configuration of a general internal write/read pulse generating circuit.
Figure 2:
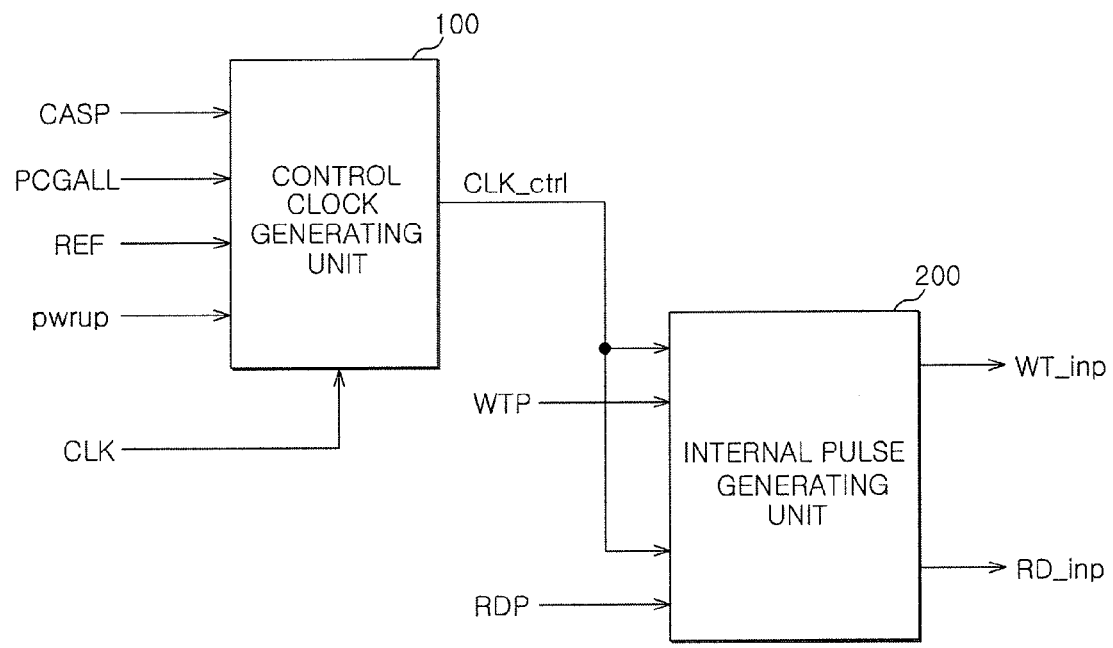
FIG. 2 is a block diagram schematically showing a configuration of an internal write/read pulse generating circuit of a semiconductor memory apparatus according to an embodiment.

An internal write/read pulse generating circuit of a semiconductor memory apparatus according to an embodiment is configured to include a control clock generating unit 100 and an internal pulse generating unit 200 as shown in FIG. 2.

The control clock generating unit 100 outputs a clock 'CLK' as a control clock 'CLK_ctrl' when a column address strobe pulse 'CASP' is input. The control clock generating unit 100 fixes the control clock 'CLK_ctrl' to a specific level when a power up signal 'pwrup' is disabled or the power up signal 'pwrup' is enabled and an all bank precharge signal 'PCGALL' or a refresh signal 'REF' is enabled. At this time, the column address strobe pulse 'CASP' is a signal transitioned to a high level for a predetermined time when the semiconductor memory apparatus receives a read command or a write command.

The internal pulse generating unit 200 outputs an external write pulse 'WTP' or an external read pulse 'RDP' as an internal write pulse 'WT_inp' or an internal read pulse 'RD_inp' in response to the control clock 'CLK_ctrl'. At this time, when the external write pulse 'WTP' or the external read pulse 'RDP' is input, the internal pulse generating unit 200 outputs the external write pulse 'WTP' or the external read pulse 'RDP' as the internal write pulse 'WT_inp' or the internal read pulse 'RD_inp' after a predetermined period of the control clock 'CLK_ctrl'.

Figure 3:
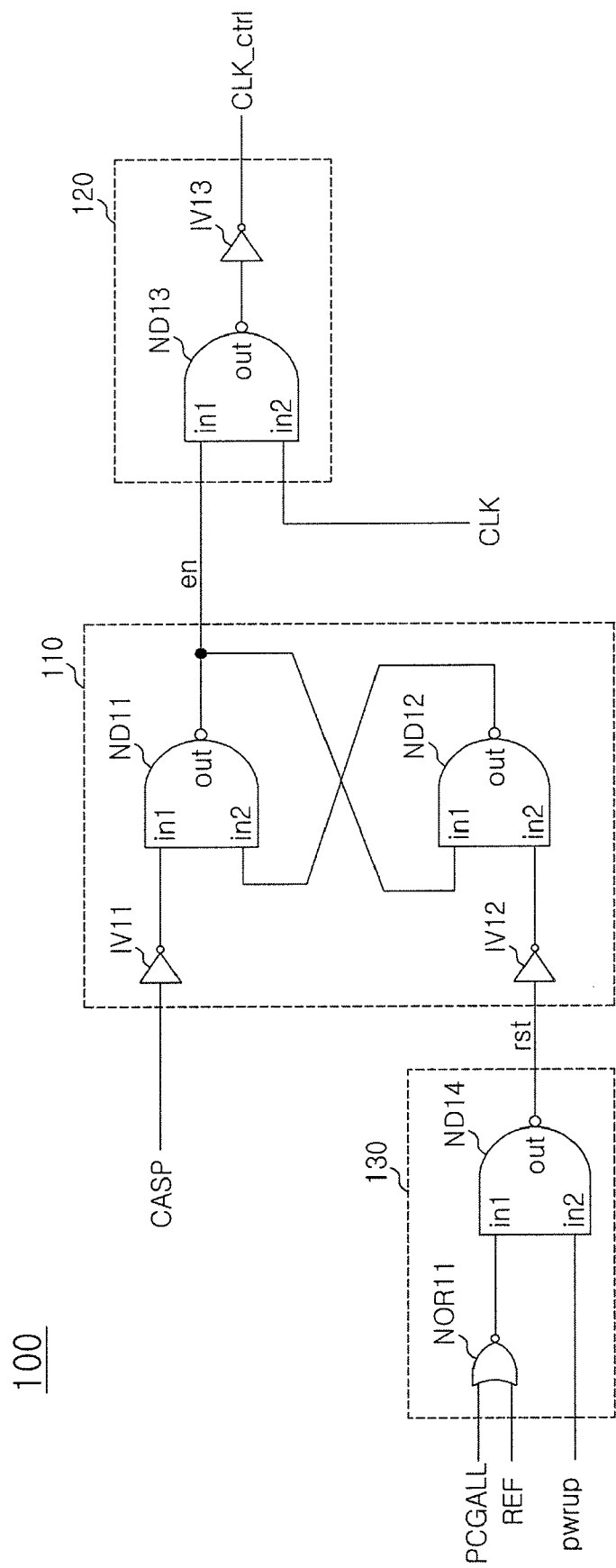
FIG. 3 is a configuration diagram of a control clock generating unit of FIG. 2.

The control clock generating unit 100 is configured to include an enable signal generating unit 110, a controlling unit 120, and a reset signal generating unit 130 as shown in FIG. 3.

The enable signal generating unit 110 generates an enable signal en enabled at a high level when the column address strobe pulse 'CASP' is input and disables the enable signal en at a low level when a reset signal 'rst' is enabled.

The enable signal generating unit 110 can be implemented by a flip flop including first and second inverters IV11 and IV12 and first and second NAND gates ND11 and ND12.

The controlling unit 120 is configured to include a third NAND gate ND13 and a third inverter IV13 to output the clock 'CLK' as the control clock 'CLK_ctrl' when the enable signal 'en' enabled at a high level is input and fix the control clock 'CLK_ctrl' to a low level regardless of the clock 'CLK' when the enable signal 'en' disabled at a low level is input.

The reset signal generating unit 130 is configured to include a NOR gate NOR 11 and a fourth NAND gate ND14 to generate the reset signal 'rst' enabled at a high level when the power up signal 'pwrup' is disabled at a low level and generates the reset signal 'rst' enabled at a high level in the case where any one of the all bank precharge signal 'PCGALL' or the refresh signal 'REF' is enabled when the power up signal 'pwrup' is enabled at a high level. Generally, when describing operations other than an initial operation (when the power up signal 'pwrup' is disabled) of the semiconductor memory apparatus, the description will be assumed in the state where the power up signal pwrup is enabled. Therefore, the reset signal generating unit 130 may enable the reset signal 'rst' when the all bank precharge signal 'PCGALL' or the refresh signal 'REF' is enabled.

Figure 4:
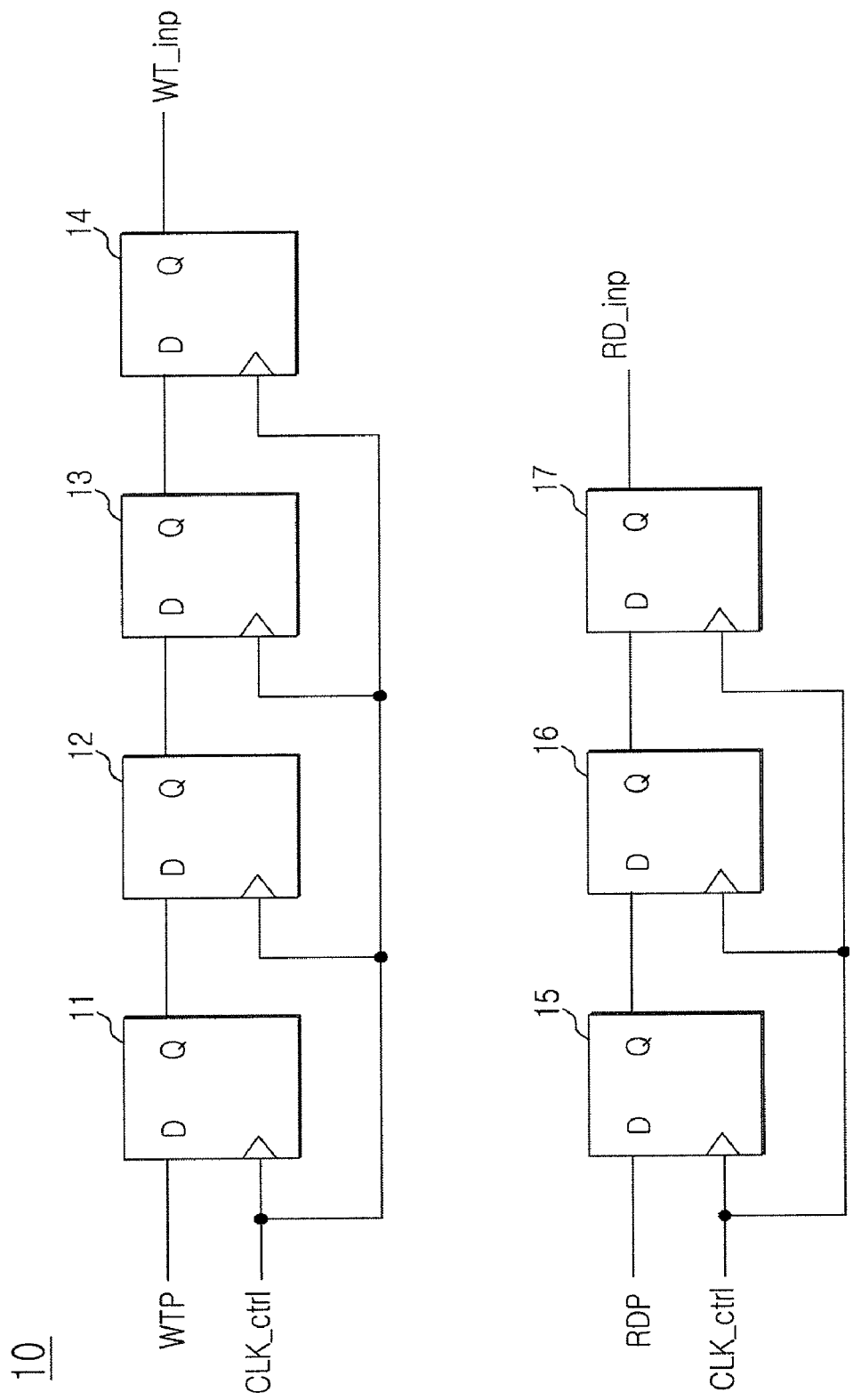
FIG. 4 is a configuration diagram of an internal pulse generating unit of FIG. 2.

The internal pulse generating unit 200 is configured to include first to seventh flip flops 11 to 17 as shown in FIG. 4. At this time, FIG. 4 shows an example configured to output the external write pulse 'WTP' as the internal write pulse 'WT_inp' after 4 periods of the control clock 'CLK_ctrl' and to output the external read pulse 'RDP' as the internal write pulse 'RD_inp' after 3 periods of the control clock 'CLK_ctrl'.

The first to fourth flip flops 11 to 14 are connected to each other in series, wherein the first flip flop '11' is configured to allow its input end to receive the external write pulse 'WTP' and the fourth flip flop 14 is configured to allow its output end to output the internal write pulse 'WT_inp'.

The fifth to seventh flip flops 15 to 17 are connected to each other in series, wherein the fifth flip flop 15 is configured to allow its input end to receive the external read pulse 'RDP' and the seventh flip flop 17 is configured to allow its output end to output the internal read pulse RD_inp. At this time, each of the first to seventh flip flops 11 to 17 receives the control clock 'CLK_ctrl' at their clock input ends respectively.

Figure 5:
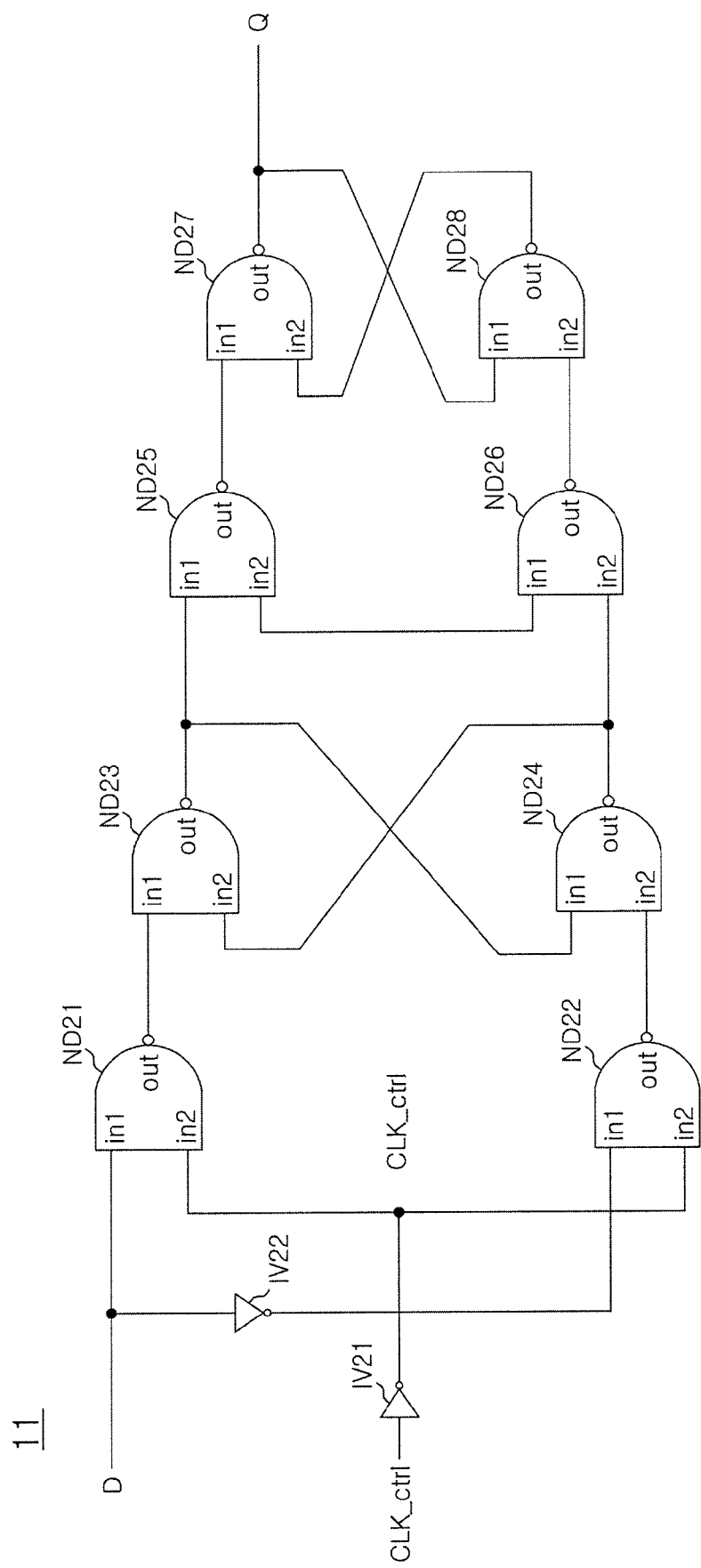
FIG. 5 is a configuration diagram of a first flip flop of FIG. 4.

Each of the first to seventh flip flops 11 to 17 can be configured of a generally used D flip flop. FIG. 5 shows the first flip flop 11. Herein, the description of the flip flops 12 to 17 may be the same as the description of the first flip flop 11.

The first flip flop 11 is configured to include fifth to twelfth NAND gates ND21 to ND28 and fourth and fifth inverters IV21 and IV22 to maintain an input D value when the control clock 'CLK_ctrl' is transitioned to a high level as an output 'Q' value until the control clock 'CLK_ctrl' is transitioned to the next high level.

Figure 6:
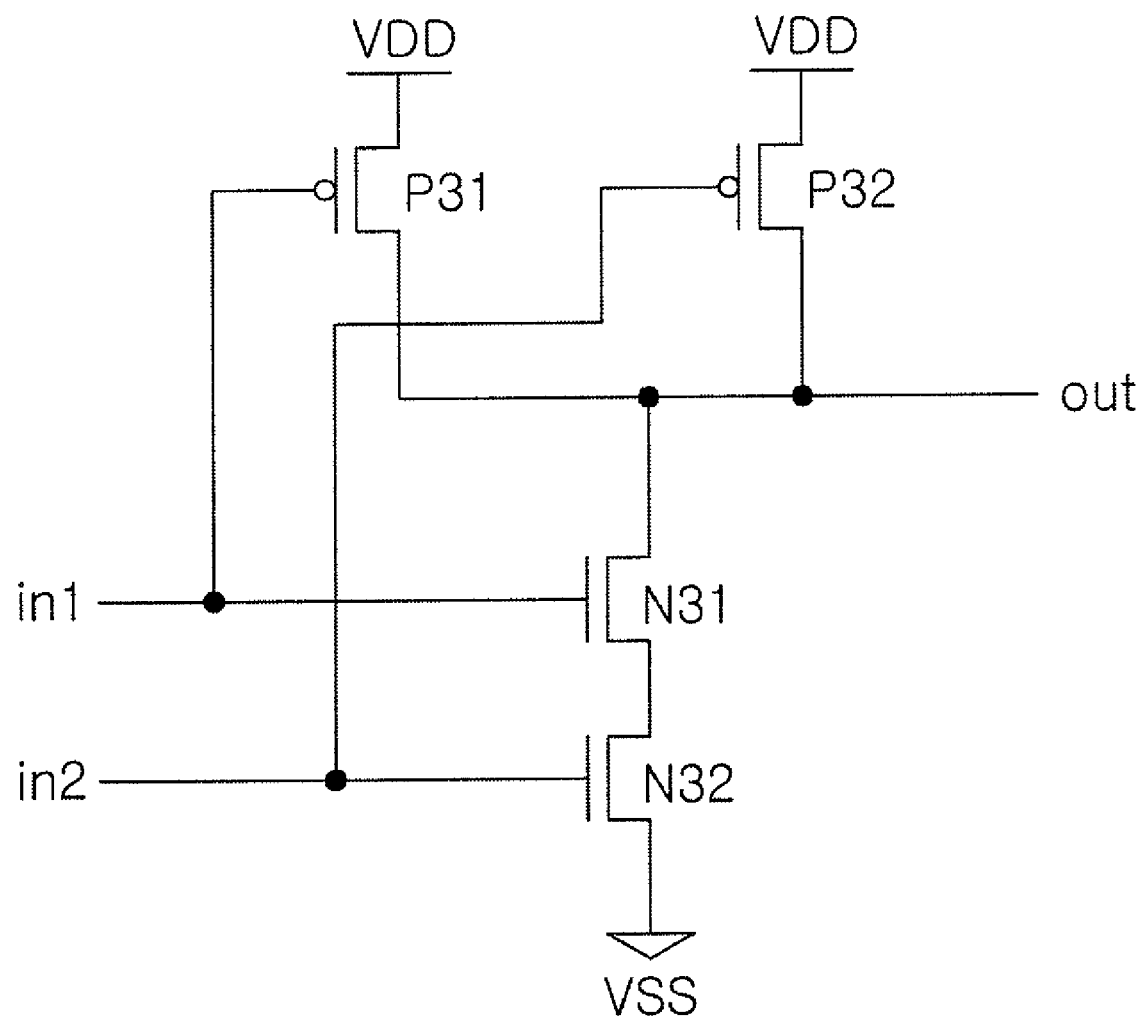
FIG. 6 is a configuration diagram of a general NAND gate.

FIG. 6 is a circuit of a general NAND gate. The NAND gate shown in FIGS. 3 and 4 can be configured as shown in FIG. 6.

The NAND gate is configured to include first to fourth transistors P31, P32, N31, and N32 to output an output 'out' as a low level only when both a first input 'in1' and a second input 'in2' are at a high level and to output the output 'out' as a high level when any one of the first and second inputs 'in1' and 'in2' is at a low level.

The internal write/read pulse generating circuit of the semiconductor memory apparatus according to the embodiment configured as above is operated as follows.

The enable signal generating unit 110 enables the enable signal en when the column address strobe pulse 'CASP' is input.

The controlling unit 120 outputs the clock 'CLK' as the control clock 'CLK_ctrl' when the enable signal 'en' is enabled.

The internal pulse generating unit 200 shown in FIG. 4 outputs the external write pulse 'WTP' as the internal write pulse 'WT_inp' after 4 periods of the control clock 'CLK_ctrl' when the external write pulse 'WTP' is input. Further, the internal pulse generating unit 200 outputs the external read pulse 'RDP' as the internal read pulse 'RD_inp' after 3 periods of the control clock 'CLK_ctrl' when the external read pulse 'RDP' is input.

The reset signal generating unit 130 enables the reset signal 'rst' at a high level when the all bank precharge signal 'PCGALL' or the refresh signal 'REF' is enabled at a high level. At this time, the power up signal 'pwrup' becomes a state enabled at a high level.

The enable signal generating unit 110 disables the enable signal 'en' at a low level when the reset signal 'rst' is enabled.

The controlling unit 120 fixes the control clock 'CLK_ctrl' to a low level regardless of the clock 'CLK' when the enable signal 'en' is disabled at a low level.

The first to seventh flip flops 11 to 17 comprising the internal pulse generating unit 200 shown in FIG. 4 do not perform the toggling operation according to the control clock 'CLK_ctrl', such that they hardly consume current unlike the related art.

Describing in more detail, each of the first to seventh flip flops 11 to 17 is configured to include the fifth to twelfth NAND gates ND21 to ND28 and the fourth and fifth inverters IV21 and IV22 as shown in FIG. 5 and each of the NAND gates ND11 to ND14 and ND21 to ND28 shown in the drawings of the embodiment is configured to include the first to fourth transistors P31, P32, N31, and N32 as shown in FIG. 6.

The fifth and sixth NAND gates ND21 and ND22 and the ninth and tenth NAND gates ND25 and ND26 shown in FIG. 5 receive the control clock 'CLK_ctrl' as a input. The fifth, sixth, ninth, and tenth NAND gates ND21, ND22, ND25, and ND26 receive the control clock 'CLK_ctrl' as the second input 'in2'. The second input 'in2' is input to the second and fourth transistors P32 and N32 as shown in FIG. 6. Therefore, the second and fourth transistors P32 and N32 repeat turn ON and turn OFF operations in response to the control clock 'CLK_ctrl' when the clock 'CLK' is input as the control clock 'CLK_ctrl' and when the control clock 'CLK_ctrl' is fixed to a low level, the second transistor P32 maintains a turn ON state and the fourth transistor N32 maintains a turn OFF state. Such a phenomenon according to the control clock 'CLK_ctrl' is generated in the NAND gates ND21,ND22, ND25, and ND26 shown in FIG. 5 as well as in the NAND gate ND13 configuring the controlling unit 120 of FIG. 3.

Therefore, the internal write/read pulse generating circuit of the semiconductor memory apparatus according to the embodiment interrupts the toggling of the clocks during the operation state, which does not need to generate the internal write/read pulse, that is, when the all bank precharge signal or the refresh signal is enabled. Therefore, the transistors repeating turn on/turn off operations in response to clocks among the transistors configuring the internal write/read pulse generating circuit are fixed to a turn on state or a turn off state unlike the related art, such that the internal write/read pulse generating circuit of the semiconductor memory apparatus according to the embodiment can reduce current consumption due to the toggling of the clocks.

While certain embodiments have been described above, it will be understood that the embodiments described are by way of example only. Accordingly, the device and the method described herein should not be limited based on the described embodiments. Rather, the devices and methods described herein should only be limited in light of the claims that follow when taken in conjunction with the above description and accompanying drawings.

What is claimed is:

1. An internal write/read pulse generating circuit of a semiconductor memory apparatus comprising:
    a control clock generating unit configured to output a clock as a control clock when a column address strobe pulse is input and fix the control clock to a specific level when an all bank precharge signal or a refresh signal is enabled; and
    an internal pulse generating unit configured to receive an external write pulse, an external read pulse, and the control clock, and generate an internal write pulse and an internal read pulse,
    wherein the internal pulse generating unit generates the internal write pulse in response to the control clock after the external write pulse is input or generates an internal read pulse in response to the control clock after the external read pulse is input, and the external write pulse and the external read pulse are input from external of the internal write/read pulse generating circuit.

2. The internal write/read pulse generating circuit of a semiconductor memory apparatus of claim 1, wherein the control clock generating unit includes:
    an enable signal generating unit configured to enable an enable signal when the column address strobe pulse is input and disable the enable signal when a reset signal is enabled;
    a controlling unit configured to output the clock as the control clock when the enable signal is enabled and fix the control clock to the specific level when the enable signal is disabled; and
    a reset signal generating unit configured to enable the reset signal when the all bank precharge signal or the refresh signal is enabled.

3. The internal write/read pulse generating circuit of a semiconductor memory apparatus of claim 2, wherein the enable signal generating unit includes flip flops.

4. The internal write/read pulse generating circuit of a semiconductor memory apparatus of claim 2, wherein the reset signal generating unit is configured to disable the reset signal when both the all bank precharge signal and the refresh signal are disabled.

5. The internal write/read pulse generating circuit of a semiconductor memory apparatus of claim 4, wherein the reset signal generating unit is configured to enable the reset signal when a power up signal is disabled and enable the reset signal in response to the all bank precharge signal and the refresh signal when the power up signal is enabled.

6. An internal write/read pulse generating circuit of a semiconductor memory apparatus configured to generate an internal write pulse after a predetermined number of clock periods of a clock when an external write pulse is input from external of the internal write/read pulse generating circuit or generate an internal read pulse when an external read pulse is input from external of the internal write/read pulse generating circuit,
    wherein when a column address strobe pulse is input, transistors responding to the clock among transistors comprising the internal write/read pulse generating circuit repeat a turn on or turn off operation according to the clock and when an all bank precharge signal or a refresh signal is enabled, the transistors responding to the clock are fixed to either of the turn on or turn off state according to a fixed level of the clock.

7. The internal write/read pulse generating circuit of a semiconductor memory apparatus of claim 6, wherein the internal write/read pulse generating circuit includes:
    a control clock generating unit configured to output the clock as a control clock when the column address strobe pulse is input and fixes the control clock to a specific level when the all bank precharge signal or the read signal is enabled; and
    an internal pulse generating unit configured to include the transistors repeating turn on or turn off in response to the control clock, the internal pulse generating uint configured to output the external write pulse as the internal write pulse or the external read pulse as the internal read pulse after a predetermined number of periods of the control clock when the external write pulse or the external read pulse is input.

8. The internal write/read pulse generating circuit of a semiconductor memory apparatus of claim 7, wherein the control clock generating unit includes:
    an enable signal generating unit configured to enable an enable signal when the column address strobe pulse is input and disable the enable signal when a reset signal is enabled;
    a controlling unit configured to output the clock as the control clock when the enable signal is enabled and fix the control clock to the specific level when the enable signal is disabled; and
    a reset signal generating unit configured to enable the reset signal when the all bank precharge signal or the refresh signal is enabled.

9. The internal write/read pulse generating circuit of a semiconductor memory apparatus of claim 8, wherein the reset signal generating unit is configured to enable the reset signal when a power up signal is disabled and enable the reset signal in response to the all bank precharge signal and the refresh signal when the power up signal is enabled.

* * * * *